United States Patent [19]

Hayes et al.

[11] Patent Number: 4,862,235

[45] Date of Patent: Aug. 29, 1989

[54] ELECTRODE STRUCTURE FOR A CORNER TURN IN A SERIES-PARALLEL-SERIES CHARGE COUPLED DEVICE

[75] Inventors: Raymond Hayes, Beaverton; Denis L. Heidtmann, Portland, both of Oreg.

[73] Assignee: Tektronix, Inc., Beaverton, Oreg.

[21] Appl. No.: 213,805

[22] Filed: Jun. 30, 1988

[51] Int. Cl.$^4$ ...................... H01L 29/78; G11C 19/28
[52] U.S. Cl. .......................................... 357/24; 377/61
[58] Field of Search ....................... 357/24; 377/57–63

[56] References Cited

U.S. PATENT DOCUMENTS

| | | | |
|---|---|---|---|
| 3,852,799 | 12/1974 | Walden | 357/24 M |
| 4,012,759 | 3/1977 | Esser | 357/24 M |
| 4,103,347 | 7/1978 | Barton | 357/24 R |
| 4,241,422 | 12/1980 | Gruter | 357/24 R |
| 4,777,519 | 10/1988 | Oshima | 357/24 M |

*Primary Examiner*—Gene M. Munson

*Attorney, Agent, or Firm*—John Smith-Hill; Peter J. Meza

[57] ABSTRACT

A CCD is fabricated from an intermediate product comprising a body of semiconductor material having a channel region of a first conductivity type bounded by a substrate region of a second, opposite conductivity type and a surface of the body, and first and second gates overlying the surface and spaced from each other. The method comprises introducing a dopant into the channel region by way of the surface of the body. The first and second gates are opaque with respect to the dopant. The dopant is such that it forms a zone within the channel region, beneath the space between the first and second gates, and the zone is of the first conductivity type and is of a higher doping concentration than other portions of the channel region. A third gate is formed over the surface of the body of semiconductor material, the third gate being at least partially disposed across the space between the first and second gates.

4 Claims, 2 Drawing Sheets

ELECTRODE STRUCTURE FOR A CORNER TURN IN A SERIES-PARALLEL-SERIES CHARGE COUPLED DEVICE

BACKGROUND OF THE INVENTION

This invention relates to a charge-coupled device (CCD) and method of fabricating the same.

It is known to use a CCD array as a serial-parallel-serial (SPS) analog shift register for high speed signal acquisition. For example, U.S. Pat. No. 4,725,748 issued Feb. 16, 1988 (Hayes et al.) discloses an SPS register using a four-phase CCD fabricated on a p-type silicon die having an n-type buried channel region.

An SPS analog shift register comprises an input serial register, an output serial register, and a parallel register that connects the input serial register to the output serial register. The parallel register is composed of multiple segments, each comprising a serial register, extending between the input register and the output register. An input signal is sampled at an input diode of the SPS shift register and consecutive samples are shifted through the input register. When the input register is full, the samples are shifted into respective segments of the parallel register, emptying the input register. The input register is filled and empties again, and as each group of samples is shifted into the parallel register the samples that were previously shifted into the parallel register are advanced by one step through the parallel register. Ultimately, each group of samples reaches the output register, and is shifted serially through the output register to an output node of the SPS shift register.

C. K. Kim, "Two-Phase Charge Coupled Linear Imaging Devices With Self-Aligned Implanted Barrier," International Electron Device Meeting, 1974, discloses an n-channel two-phase CCD in which alternate pairs of transfer gates are connected to two clock phases respectively. The gates are formed of polysilicon that has been deposited in two stages over a layer of gate oxide, so that each pair of gates comprises a lower level polysilicon gate and an upper level polysilicon gate. The upper level gates each have at least one edge region that partially overlaps an adjacent lower level gate. After the lower level polysilicon has been applied, and before the upper level polysilicon is applied, an implantation of a p-type dopant takes place. During this implantation, the lower level polysilicon serves as an implantation mask. The ions of the p-type dopant partially compensate the effect of the n-type dopant in the channel region. Accordingly, zones of n conductivity but having a lower net concentration of n-type dopant are formed in the channel region beneath the upper level gates, and form potential barriers between the n-type zones beneath the lower level gates. The width of the potential wells between the barriers depends on the width of the lower level gates.

As shown in FIG. 1A of the drawings, a two-phase CCD of the kind shown by Kim may be used in an SPS shift register. The direction of charge transfer is indicated by the arrow 12. The juncture between the input serial register 2 and one of the segments 4 of the parallel register is at the location of a potential well 6 of the serial register. In order to allow high speed operation of the register, it is desirable that this well be small, so that the distance traveled by an electron passing through the well is short. Referring to FIG. 1B, the size of the well 6 depends on the size of the lower level polysilicon gate 8 that overlies the well 6 and thus forms a mask with respect to the p-type implantation 10 that forms the barrier between wells. Accordingly, the time taken for an electron entering the well along the path A to pass through the well in the serial direction depends on the distance X and the time taken for such an electron to make a corner turn from the serial direction to the parallel direction and enter the parallel register depends on the distance Y.

The dopant that is generally used to form the p-type implant in a two-phase CCD of the kind shown by Kim is boron. Under certain processing conditions, boron will diffuse from the implant through the gate oxide under the lower level polysilicon, resulting in threshold shifts which may adversely affect the operation and manufacturability of the device.

It is known that in fabrication of integrated circuits, design rules for a given photolithographic process generally allow a lower minimum for the width of a space between conductor runs than for the width of conductor run.

SUMMARY OF THE INVENTION

A preferred embodiment of the present invention in a first aspect is a CCD that comprises a body of semiconductor material having a channel region of a first conductivity type bounded by a substrate region of a second, opposite conductivity type and a surface of the body. The body of semiconductor material has, within the channel region, a zone of the first conductivity type and of higher doping concentration than other portions of the channel region. An electrode structure overlies the surface of the body and is composed of at least first, second, and third gates. The first and second gates are spaced from each other, and the zone of the first conductivity type is beneath the space between the first and second gates. The third gate extends at least partially across the space between the first and second gates.

A preferred embodiment of the invention in its second aspect is a method of fabricating a CCD from an intermediate product comprising a body of semiconductor material having a channel region of a first conductivity type bounded by a substrate region of a second, opposite conductivity type and a surface of the body, and first and second gates overlying the surface and spaced from each other. The method comprises introducing a dopant into the channel region by way of the surface of the body, the first and second gates being opaque with respect to the dopant and the dopant being such that it forms a zone within the channel region, beneath the space between the first and second gates. The dopant is such that the zone is of the first conductivity type and is of a higher doping concentration than other portions of the channel region. The method also comprises forming a third gate over the surface of the body of semiconductor material, the third gate being at least partially disposed across the space between the first and second gates.

A preferred embodiment of the invention in its third aspect is a method of forming a charge-coupled device from a body of semiconductor material comprising introducing a dopant into the body by way of a surface thereof, to form a channel region of a first conductivity type within the body of semiconductor material, which is of a second conductivity type. First and second gates are formed over the surface of the body, the first and second gates being spaced from each other. A dopant is introduced into the body by way of its surface, the first and second gates being opaque with respect to the dopant so that the dopant enters a zone of the body beneath the space between the first and second gates, and the dopant being such that the zone is of the first conductivity type and is of a higher doping concentration than other portions of the channel region. A third gate is formed over the surface of the body, the third gate being at least partially disposed across the space between the first and second gates.

BRIEF DESCRIPTION OF THE DRAWINGS

For a better understanding of the invention, and to show how the same may be carried into effect, reference will now be made, by way of example, to the accompanying drawings in which.

Figure 1A:
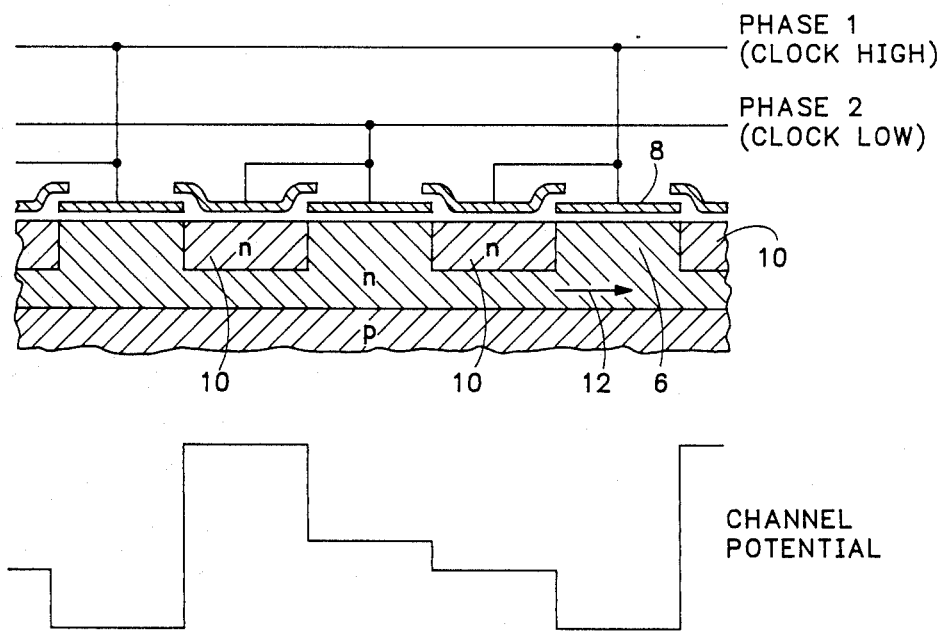
FIG. 1A is a diagrammatic partial cross-sectional view of an SPS analog shift register based on a conventional two-phase CCD and illustrates the potential profile within the channel region.
Figure 1B:
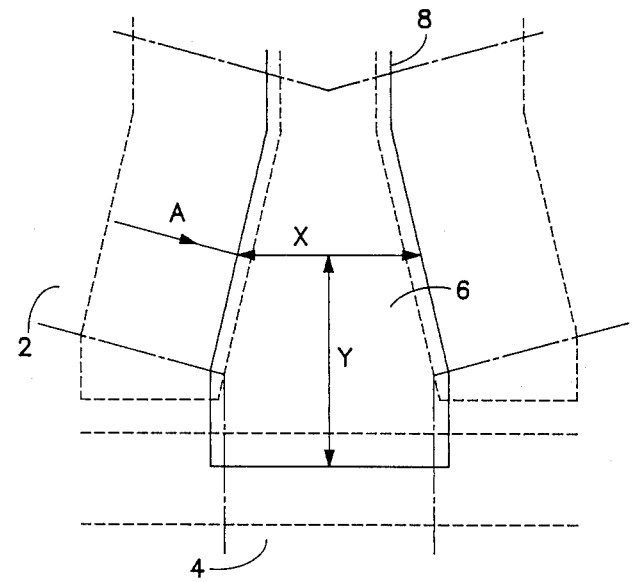
FIG. 1B shows a plan view of the juncture between the input register of the SPS shift register and one segment of the parallel register of the SPS shift register according to the present invention.
Figure 2A:
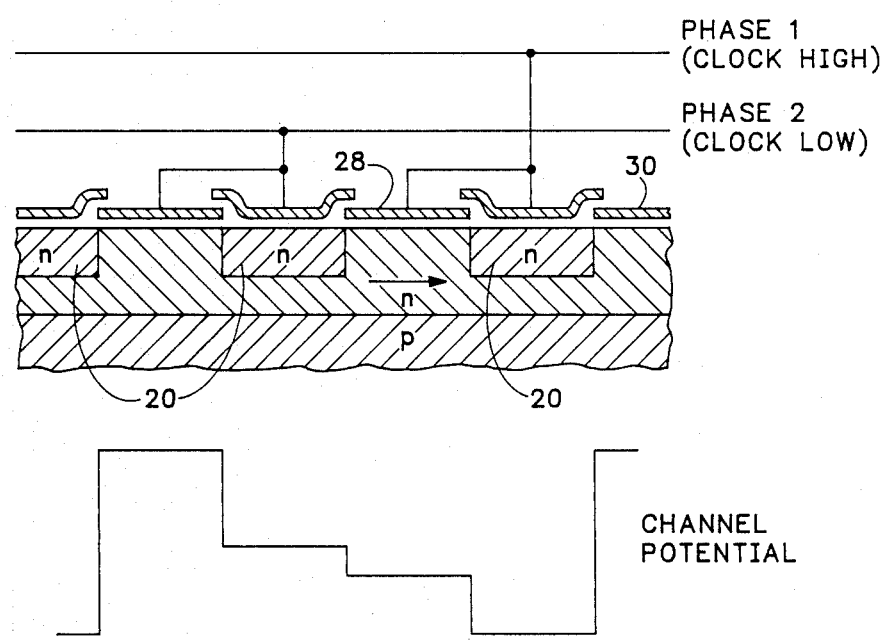
FIG. 2A is a diagrammatic partial cross-sectional view of an SPS analog shift register based on an alternative two-phase CCD and illustrates the potential profile within the channel region.
Figure 2B:
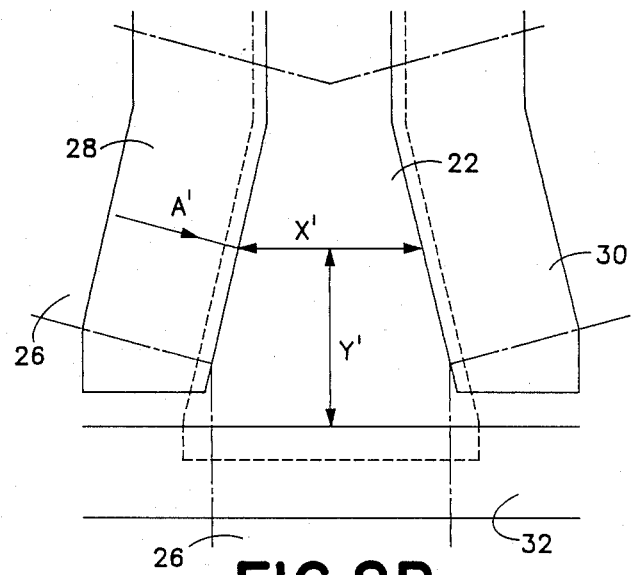
FIG. 2B shows a plan view of the juncture between the input register of the SPS shift register and one segment of the parallel register of the SPS shift register according to the present invention.

In the plan views shown in FIGS. 1B and 2B, the lower level gates are marked in solid lines, the upper level gates with dashed lines, and the buried channel region with dot-dashed lines.

DETAILED DESCRIPTION

In the case of the CCD shown in FIG. 2A, the dopant that is implanted into the channel region after formation of the lower level gates is an ntype dopant. The resulting doping concentration in the zones 20 beneath the upper level gates is higher than the doping concentration in other parts of the channel region. The doping concentration in the zones 20 may be about twice that in other parts of the channel region. Accordingly, a potential well is formed beneath the space between each pair of adjacent lower level gates while potential barriers are formed between adjacent wells. Referring to FIG. 2B, the well 22 at the juncture between the serial register 24 and one of the segments 26 of the parallel register is formed beneath the space that is between two lower level gates 28, 30 of the serial register and is bounded by the first gate 32 of the parallel register. The time taken for an electron entering the well 22 along the path A' to pass through the well in the serial direction depends on the distance X', and the time taken for such an electron to make a corner turn from the serial direction to the parallel direction and enter the parallel register depends on the distance Y'. If the FIGS. 1B and 2B devices are fabricated using the same set of design rules, the well 22 of the FIG. 2B device can be made physically smaller, in directions parallel to the surface of the die, than the well 6 of the FIG. 1B device, so that the distances X' and Y' are smaller than the distances X and Y respectively, and accordingly the propagation time through the well 22 is shorter than the propagation time through the well 6.

The n-type implant can be carried out using phosphorus, which avoids the problem associated with use of a boron implantation.

It will be appreciated that the present invention is not restricted to the particular embodiment that has been described, and that variations may be made therein without departing from the scope of the invention as defined in the appended claims and equivalents thereof. For example, the invention is not limited to an SPS register and may be applied to other CCDs where narrow wells are desired, e.g., other high speed analog shift registers and high resolution imaging arrays.

We claim:

1. A charge-coupled device having an electrode structure suitable for use as a corner turn in a series-parallel-series configuration comprising:

a body of semiconductor material having a channel region of a first conductivity type bounded by a substrate region of a second, opposite conductivity type and a surface of the body, the body of semiconductor material having, within the channel region, a zone of said first conductivity type and of different doping concentration than other portions of the channel region, and an electrode structure that overlies said surface and is composed of at least first, second, and third gates, the first and second gates being spaced from each other, and said zone of said first conductivity type being beneath the space between the first and second gates, and the third gate extending at least partially across the space between the first and second gates wherein the first and second gates are each elongate, have an angled end portion, and have a length component parallel to a predetermined direction, the electrode structure further comprising a fourth gate that extends transverse to said predetermined direction and is spaced from the angled end portions of the first and second gates, the third gate and said zone of said first conductivity type having a generally triangular shape defined by the angled portions of the first and second gates, and the fourth gate.

2. A device according to claim 1, wherein the first and third gates are electrically connected together and the second gate is electrically isolated from the first and third gates.

3. A device according to claim 1, wherein the first and second gates comprise series register segments.

4. A device according to claim 1, wherein the fourth gate comprises a parallel register segment.

* * * * *